United States Patent [19]

DeLuca et al.

[11] 4,238,837
[45] Dec. 9, 1980

[54] DOMAIN DRAG EFFECT DEVICES

[75] Inventors: John C. DeLuca; Richard J. Gambino, both of Yorktown Heights, N.Y.

[73] Assignee: International Business Machines Corporation, Armonk, N.Y.

[21] Appl. No.: 959,807

[22] Filed: Nov. 13, 1978

[51] Int. Cl.² .............................................. G11C 19/08
[52] U.S. Cl. ....................................... 365/28; 365/19; 365/25; 365/34
[58] Field of Search ........................ 365/19, 20, 21, 34, 365/27, 28, 25

[56] References Cited
PUBLICATIONS

IEEE Transactions on Magnetics–vol. Mag–14; No. 5, Sep. 1978, pp. 500–502.

*Primary Examiner*—James W. Moffitt
*Attorney, Agent, or Firm*—Graham S. Jones, II

[57] ABSTRACT

A domain drag effect stripline pattern of conductive magnetic bubble material deposited upon a substrate is located in a magnetic bias field preferably normal to the plane of the stripline. Magnetic bubbles can be propagated through the stripline in response to passage of D.C. current pulses through the stripline. The width and cross-sectional area of the stripline is preferably substantially constant except at a switching area where it may be different, and preferably wider. There a coil is juxtaposed with the stripline to apply a magnetic field upon the switching area with the magnetic field varying above and below a critical value to switch the propagation of magnetic bubbles along the stripline on and off as a function of the current through the coil. Alternatively, the external magnetic bias field can be modulated to turn the stripline switch on and off. In another aspect of this invention a domain drag effect velocity modulator apparatus is provided at modulation points by varying the magnetic field at the modulation points. Such modulation can slow down or speed up the bubble velocity, depending upon the design.

12 Claims, 24 Drawing Figures

FIG. 19A  H_BIAS=0 Oe
FIG. 19B  H_BIAS=535 Oe
FIG. 19C  H_BIAS=940 Oe
FIG. 19D  H_BIAS=1040 Oe
FIG. 19E  H_BIAS=1340 Oe
FIG. 19F  H_BIAS=1440 Oe

DOMAIN DRAG EFFECT DEVICES

DESCRIPTION

1. Technical Field

This invention relates to magnetic bubble devices and more particularly to magnetic bubble devices displaying the domain drag effect.

2. Background Art

Chaudhari et al, "Bubble Domain Manipulation Using Induced Magnetic Fields," IBM TDB, Vol. 19, No. 7, Dec. 1976, pp. 2741-3 describes the concept for the use of a propagation current passed through amorphous bubble materials. However, this article does not embody the domain drag effect as it is now understood. No magnetic bias field normal to the plane is described, and no switching means is described.

Chaudhari et al, "Bubble Propagation by Domain Drag in Amorphous Films," IBM TDB, Vol. 21, No. 4, Sept. 1978, pp. 1708-9 shows a magnetic bubble domain stripline using Gd Co Mo bubble material. It mentions the concept of using a D.C. bias field perpendicular to the surface of the stripline, and it states that propagation of bubbles can be obtained by transmitting a current pulse along the stripline. However, it does not state any relationship between bubble velocity and the magnitude of an external magnetic bias field.

DeLuca et al, "Observation of a Domain Drag Effect in Amorphous Gd Co Mo Films," IEEE Trans. on Magnetics, Vol. Mag.-14, No. 5, September 1978; pages 500-502 states that bubbles were generated initially in the presence of a 200 Oe D.C. bias field with a pulse of current. Subsequently the bias field was removed and the bubbles produced were propagated by the domain drag effect by introducing a current along the stripline. The paper also teaches that in an amorphous thin film stripline the velocity of propagation of bubbles by the domain drag effect is proportional to mobility times the difference between the drive field $H_D$ and the coercivity field $H_c$. There is no suggestion of use of the information in that equation for the purpose of selective control of the velocity of bubbles. Nothing in the equation suggests that a change in velocity or a reduced or a minimum value of velocity can be reached as the bias field is increased, which is at the crux of this invention since we have discovered the propagation of bubbles at a control point can be altered or blocked. What is even more surprising is that the velocity increases again as the bias field increases.

DISCLOSURE OF THE INVENTION

Figure 1:
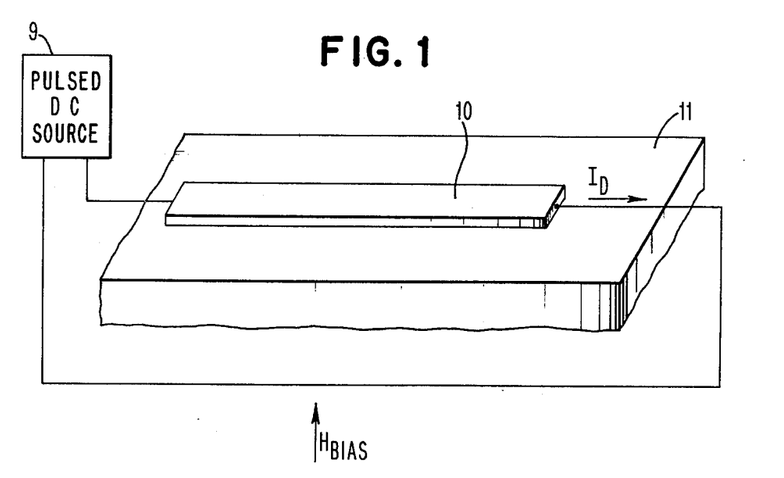
FIG. 1 shows a perspective view of an amorphous bubble material stripline deposited upon a chip connected to a pulse source.

FIG. 1 shows a typical domain drag effect stripline of the variety employed in connection with this invention. A thin film stripline 10 of a conductive magnetic bubble material such as Gd Co Au or amorphous Gd Co Mo is deposited upon a substrate 11. A pulsed direct current source 9 passes a D.C. drive current $I_D$ through the stripline 10 causing magnetic bubble domains to propagate through the stripline 10. The drive current through the stripline 10 is $I_D$ and the density of the current per unit cross-sectional area of the stripline is a variable J. $J = I_D$ divided by the quantity A where A is the cross-sectional area of the stripline 10. Since the stripline will be assumed to have a uniform thickness (h), to simplify discussion the area A varies with the width W of the stripline at any given cross-section. Generally speaking, the velocity of propagation v of a magnetic bubble travelling through the stripline varies as a function of the current density J through the amorphous stripline 10.

Figure 2:
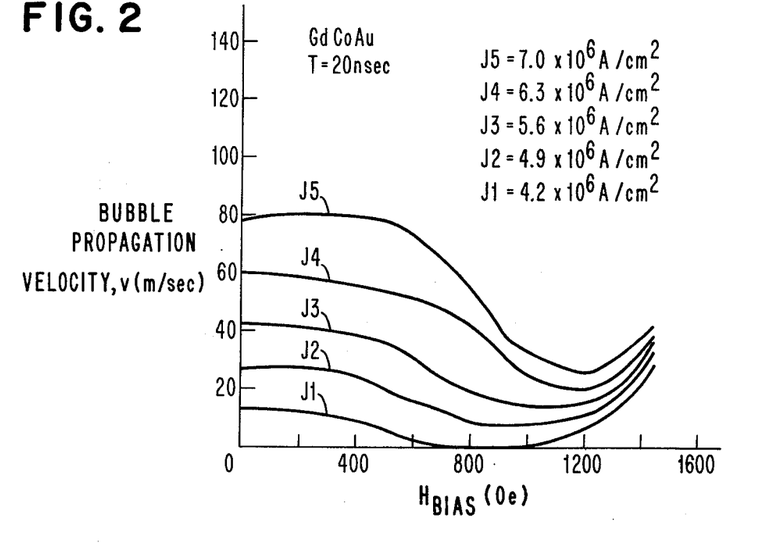
FIG. 2 shows bubble propagation velocity v during a drive current pulse $I_D$ as a function of bias field $H_{bias}$ for a pulse length T=20 nsec and various drive current densities J for a Gd Co Au alloy.

We have discovered the fact that when using the domain drag effect, for certain sufficiently low levels of the drive current density J, in the presence of a critical value or range of values of magnetic biasing field $H_{bias}$, the velocity of propagation v reaches zero. FIG. 2 illustrates this fact where current $I_D$ has a pulse length $T = 20 \times 10^{-9}$ sec (20 nsec) for a device described in greater detail under "Experimental Techniques and Results." The vertical axis is velocity (v) of propagation of bubbles in meters per second (m/sec) while the current $I_D$ is on. The horizontal axis is the value of a magnetic bias field $H_{bias}$ directed normal to an amorphous bubble domain stripline manifesting the domain drag effect.

A first current density value of the pulses of drive current is indicated as $J_1$. A second value of drive current density is indicated as $J_2$. The critical distinction between the current density value $J_1$ and values $J_2$-$J_5$ is that as $H_{bias}$ rises above 600 Oe, a point (referred to below as a critical value) is reached for curve $J_1$ at which velocity v is zero, which means that bubble propagation is stopped. At higher currents $J_2$-$J_5$, however, while a minimum value of velocity is reached at 800–1200 Oe of $H_{bias}$, propagation of bubbles continues.

Figure 3:
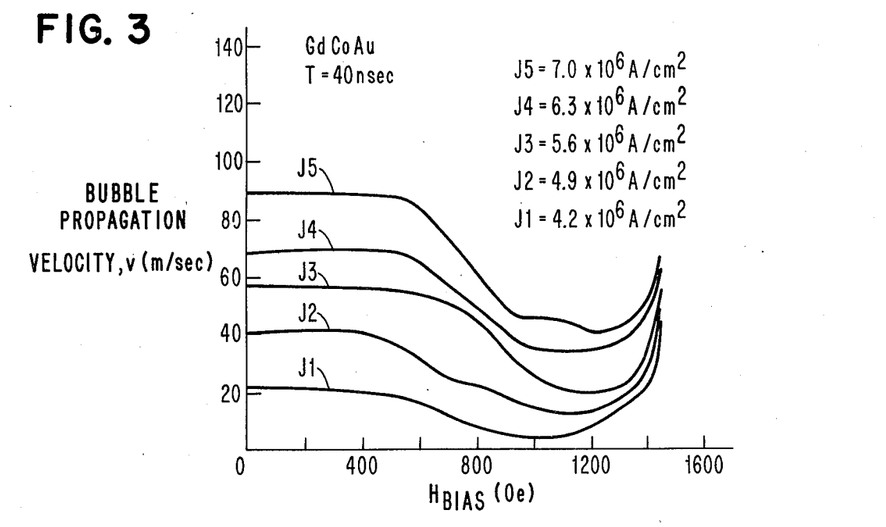
FIG. 3 also shows velocity v as a function of bias field $H_{bias}$ for a pulse length T=40 nsec and various drive current densitites J for a Gd Co Au alloy.

FIG. 3 shows that even though the current density $J_1$ is used, for a duration of the drive current $I_D$ for a pulse length of T=40 nsec, the minimum velocity is greater than zero. Referring again to FIG. 2, it should be noted that the curve for current density $J_1$ rises again from zero velocity v as $H_{bias}$ rises above 1000 Oe. Above a minimum current density between $J_1$ and $J_2$, for T=20 nsec, the minimum velocity v for a given J curve will be greater than zero for this alloy and the dimensions of this device.

There are several kinds of preferred inventive embodiments which we contemplate as aspects of this invention which we have devised subsequently to making the above discovery. Those embodiments are described below. They include a new family of domain drag effect switches and modulators which control bubble domain propagation velocity by means such as locally modifying the magnetic field along a domain drag effect device such as stripline 10 in FIG. 1.

Figure 4:
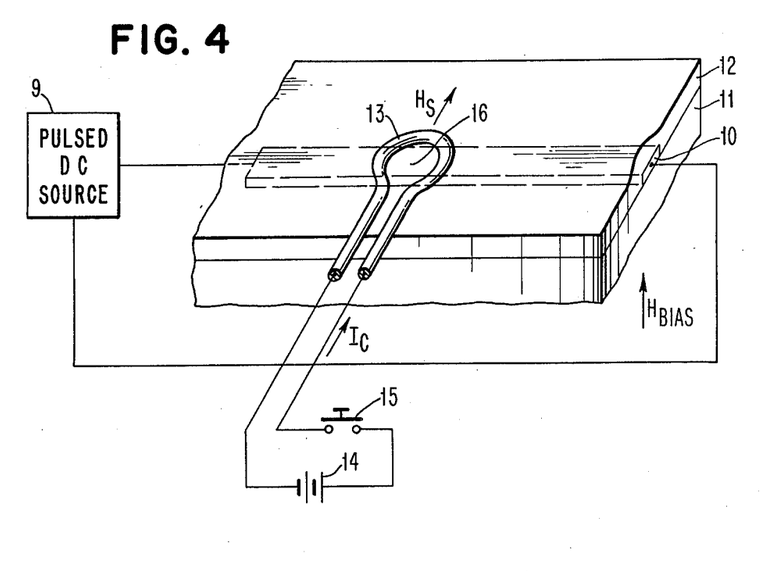
FIG. 4 shows a domain drag effect switch.

FIG. 4 shows the substrate 11 and domain drag effect stripline 10 of FIG. 1 modified by coating it with a thin insulation layer 12, with the same pulses D.C. current source. However, the device has been further modified by adding a coil 13 above stripline 10. Coil 13 is connected to a voltage source 14 through normally open switch 15. Passing a current $I_c$ through coil 13 produces a supplemental magnetic field $H_s$ in the same direction as magnetic bias field $H_{bias}$. Bias field $H_s$ is concentrated mainly in "switching" area 16. Referring to FIG. 2, it is assumed that $H_{bias}$ is below its critical level or range (e.g., from 800–1000 Oe for current density $J_1$ or the equivalent value for other devices, different pulse lengths T, etc. which are capable of providing zero velocity). In any such case, if $H_s$ plus $H_{bias}$ produces a total field exceeding the critical level of field (e.g., 800 Oe, FIG. 2) and within the critical range (e.g., 800–1000 Oe, FIG. 2) then propagation of bubbles through switching area 16 can be turned off. By subsequently opening switch 15 to remove field $H_s$ propagation of bubbles can be switched back on. Thus, area 16 comprises a control area which can control the domain drag effect in an on-off sense.

In addition, the device of FIG. 4 can be operated as a bubble velocity modulator at a specific point by employing a pulsed D.C. source 9 which produces a current $I_D$ capable of generating a higher current density (e.g., about $J_2$ or higher for a pulse of T=20 nsec in FIG. 2) or a longer pulse (e.g., FIG. 3). Following the curves $J_2$–$J_5$ in FIG. 2, one can move along a curve $J_2$ from $H_{bias}$=400 Oe to a local $H_{bias}$ in the control area 16 which will modulate bubble velocity from 25 m/sec to about 10 m/sec at 800 Oe. Employing current density $J_5$, with $H_{bias}$=500 Oe, the velocity can be modulated from about 80 m/sec to about 35 m/sec by raising the control bias to 1200 Oe in FIG. 2.

Figure 5:
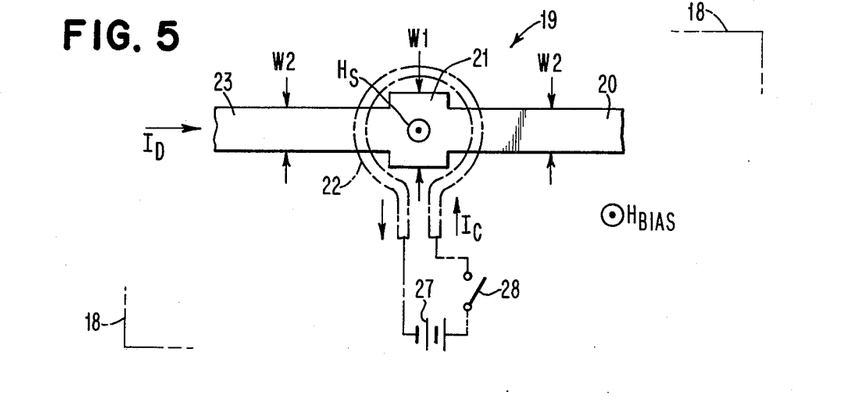
FIGS. 5 and 6 show similar modified domain drag effect switches.

FIG. 5 shows a schematic drawing of a plan view of a bubble domain switch 19 (on substrate 18 in phantom) comprising a stripline 20 which is of a narrow width $W_2$ except at control area 21 where it widens to width $W_1$. For convenience of discussion, width $W_1$ provides current density $J_1$ in FIG. 2 and width $W_2$ provides current density $J_2$ in FIG. 2. Normally, at a value of $H_{bias}$=400 Oe, the velocity through control area 21 is about 10 m/sec and the velocity through the remainder of stripline 20 is about 25 m/sec because of the higher current density $J_2$ there. If the magnetic field at area 21 is raised to about 800 Oe, then bubble propagation at that point is arrested. Thus, for example, if current $I_C$ through coil 22 (shown in phantom) produces a supplemental magnetic field $H_s$ of about 400 Oe and $H_{bias}$ is also 400 Oe, bubble propagation will be arrested in area 21, while bubbles (in the direction of current $I_D$ depending upon the Hall coefficient) will continue to propagate along the remainder of the stripline 20. Bubbles traveling from point 23 to point 24 will continue to travel until they are blocked by the fact that area 21 is "turned off." Thus, electrical switch 28 and battery 27 create a current in coil 22 which adds to $H_{bias}$ to "turn off" the switch 19.

A further modification of FIG. 5 involves employing a variable source of $H_{bias}$ from a field coil having an adjustable current which increases $H_{bias}$ in general until the bias field on the entire stripline 20 of switch 19 is raised to, say, 800 Oe in FIG. 2 so that bubble propagation is arrested in switching area 21 but not in the remainder of switch 19. In that case, no current need be passed through coil 22 and switch 19. This embodiment will be useful where all switches (in a bubble propagation system involving many switches) are to be turned on and off in synchronism without the kind of individual switch control afforded by means of coil 22.

Figure 6:
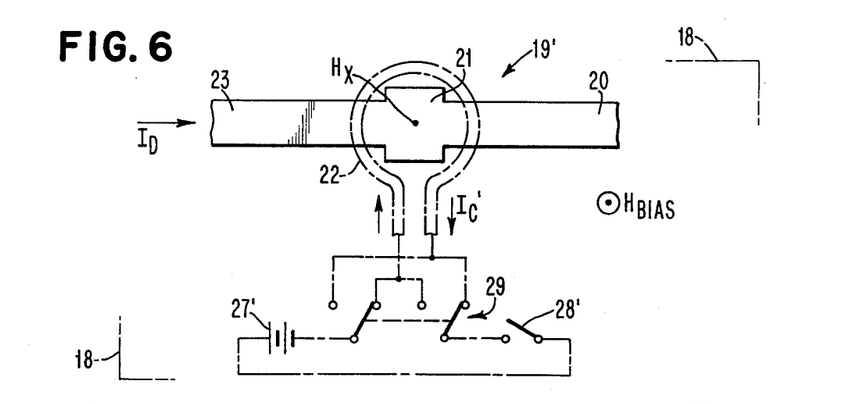

In FIG. 6 the design of the switch 19' is improved over that of switch 19 in FIG. 5 simply by increasing $H_{bias}$ to 800 Oe and reversing the polarity as shown by battery 27'. A current reversing double-pole, double-throw switch 29 is also included. When electrical switch 28' is open as shown in FIG. 6, the bubble domain switch 19 is off because bubbles will not propagate at a bias of 800 Oe in control area 21 where drive current I produces current density $J_1$. To turn switch 19 on in FIG. 6, there must be a magnetic field $H_x$ (indicated by a dot to indicate a reversible direction x) directed down produced by coil 22 to oppose $H_{bias}$ in control area 21. Closing switch 28' produces the current in coil 22 which generates such a magnetic field $H_x$ down in control area 21. In this case, control area 21 is biased at 400 Oe and has a current density $J_1$ in FIG. 2 so the bubble propagation velocity v in FIG. 2 is about 10 m/sec. The narrower areas of the stripline remain biased at 800 Oe by $H_{bias}$ and at a current of $J_2$, the bubble propagation velocity is close to about 10 m/sec. Accordingly, when the control current $I_C'$ is turned on, the bubbles propagate through the bubble domain switch 19' at the same velocity in the control area 21 as in the areas from points 23 to 24 and 25 to 26 which may be employed as shift register areas, under the influence of a drive current I producing currents $J_1$ and $J_2$ as described above where T=20 nsec for this particular set of films.

Alternatively, switch 29 shown in FIG. 6 permits one to turn on the switch 19' when switch 28' closes by reversing the direction of current from battery 27' to that shown in FIG. 6 by reversing dpdt switch 29 while retaining $H_{bias}$ equal to about 800 Oe. Thus the value of field in the control area 21 can be raised high enough to permit bubble propagation by increasing the bias field above the critical range in FIG. 2 for current density $J_1$ and the equivalent.

Figure 7:
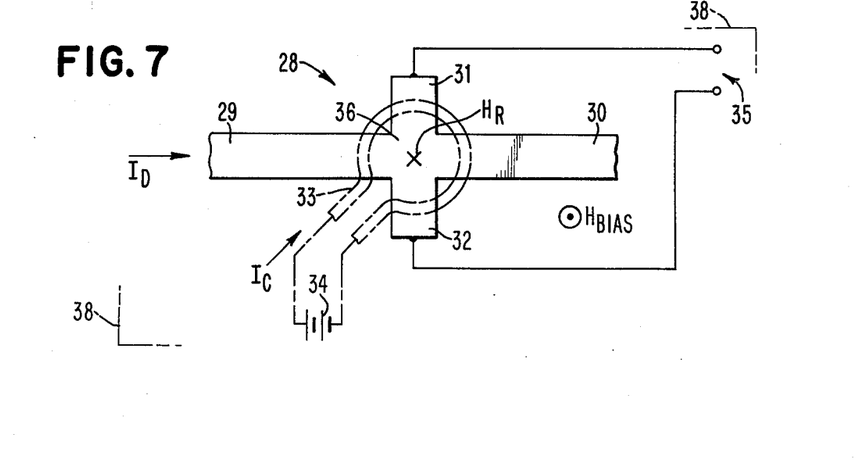
FIGS. 7 and 8 show domain drag effect Hall effect bubble sensors.
Figure 8:
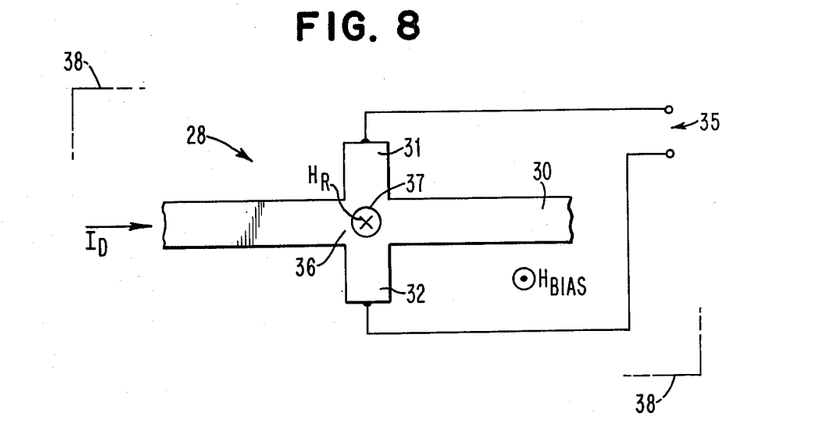

FIGS. 7 and 8 show similar Hall effect domain drag effect bubble sensors (deposited on substrate 38 shown in phantom) designed in accordance with another aspect of this invention. The stripline 29 to 30 is widened at sensor area 36 which also has a wide cross-sectional area. A substantial bias field (e.g., $H_{bias}$=800 Oe) is employed as in FIG. 2. Thus, in sensor area 36 if the current density is $J_2$ in areas 29 and 30, the Hall effect sensor 28 resembles a switch. Accordingly, a reverse bias field $H_R$ is provided by coil 33 and battery 34 yielding a current $I_C$ through the coil in FIG. 7. In FIG. 8 a small permanent magnet 37 is deposited above area 36. Both coil 33 and magnet 37 produce a magnetic field directed into the page opposing $H_{bias}$ which is shown directed out of the page. Other means of modifying the field in sensor area 36 are described following FIG. 14.

OPERATION OF HALL EFFECT DEVICES

The operation of the devices of FIGS. 7 and 8 as Hall effect devices is as follows: When a current $I_D$ flows between 38 and 39 and a Hall effect voltage $V_H$ is detected between 31 and 32 for a saturated sample (no bubble domains in the detector), $V_H$ is given by:

$$\rho_H = \frac{V_H}{I_D}(h) \text{ or } V_H = \frac{\rho_H I}{h}$$

where $\rho_H$, the Hall resistivity, is a materials parameter, and h is the film thickness. If a bubble is present in the detector, $V_H$ will be lower, depending on the area of the detector covered by a reverse domain. If the detector area is completely filled or overfilled with one bubble, a signal equal in magnitude to $V_H$ but opposite in sign will be detected.

BUBBLE ENCODER

Figure 9:
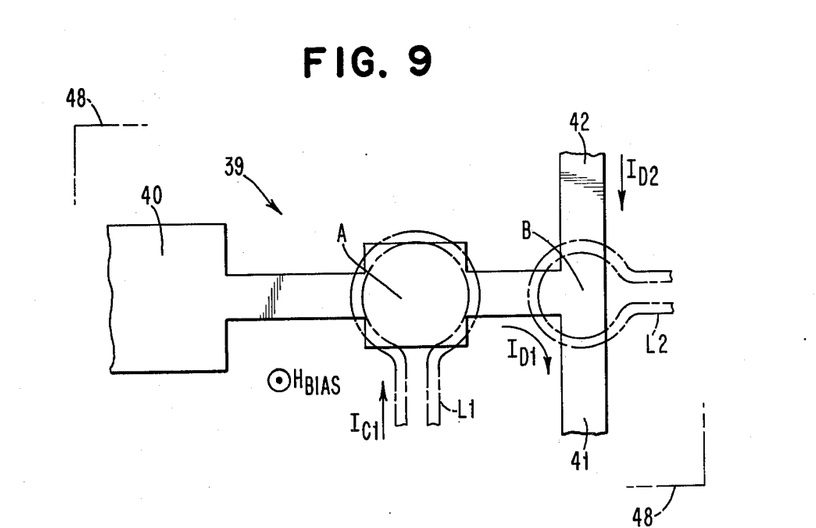
FIG. 9 shows a domain drag effect bubble encoder.

A device for encoding with bubbles stored in a bubble raft and for then subsequently transferring the bubbles into a shift register is illustrated by FIG. 9. The device 39 is deposited upon a chip 48 shown in phantom. Employing binary counting in which the presence of a bubble signifies a "1," generation of a "1" involves transferring a bubble to a shift register stripline 42-41 from a bubble raft stored on a pad 40 of bubble material which has been packed with a very large number of bubbles previously.

A current $I_{D1}$ is sent along path 40-41 and at the same time, conductor loops $L_1$ and $L_2$ are activated with currents $I_{C1}$ and $I_{C2}$. A bubble from the bubble raft in pad 40 will thus be permitted to pass through a normally off gate switch A. The control current $I_{C1}$ is turned off but currents I and $I_{C2}$ are maintained to propagate the bubble to switch B. The bubble can then be propagated along shift register 42-41 by a current $L_{D2}$. Alternatively, the field produced by current $I_{C2}$ in loop $L_2$ can be provided instead by means of a thin film permanent magnet (e.g., polycrystalline $SmCo_5$) deposited over the stripline 42-41 and patterned by photolithography so as to provide the needed reverse bias field at B continuously as in FIG. 8. Permanent magnets can be used in place of conductor loops at points in any other device where the current density is low such as at intersections and where a constant velocity is required at all times, as in FIG. 8.

Figure 10:
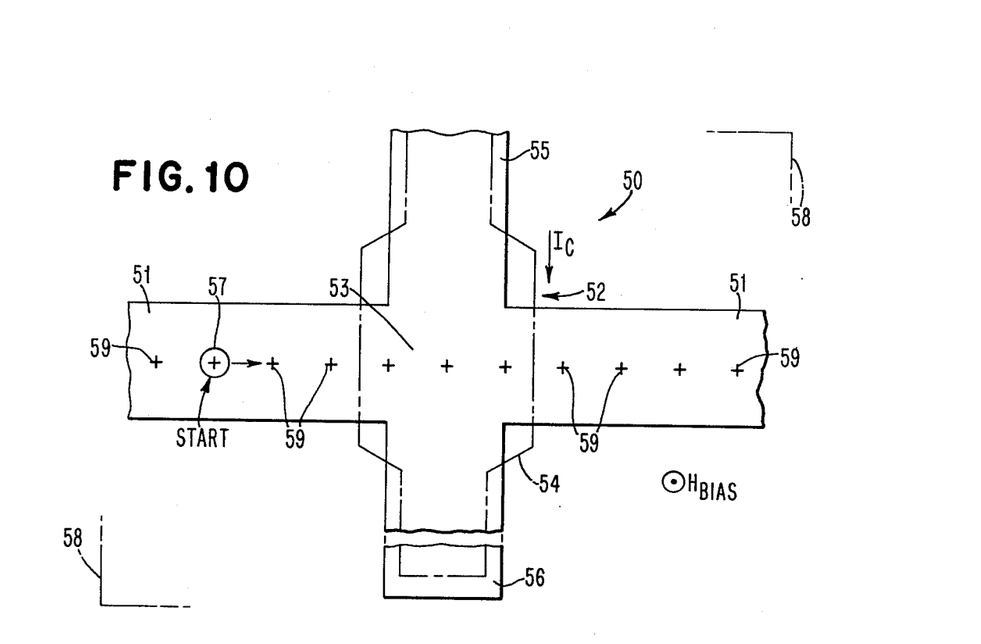
FIG. 10 shows a domain drag effect switch similar to the switch of FIG. 6.

FIG. 10 shows a plan view of a schematic drawing of device 50 (deposited upon a chip 58 shown in pahntom) comprising a stripline 51 with a switch 52 with a control area about which a single turn coil 54 is shown. Joining the stripline 51 at the control area 53 is a set of transverse bubble material lines 55 and 56 which are so long as to be effectively infinite in length because the effective resistance is so high. A bubble 57 is shown in the "start" position from which the velocity measurements begin in FIG. 11. The stripline 51 is narrower, on the order of 22.5 $\mu$m wide, which is about half the width of the stripline of FIGS. 2 and 3. We have found that the velocity curves employed there do not apply, since bubble velocity measured down the center of the stripline is reduced for narrower striplines.

Figure 11:
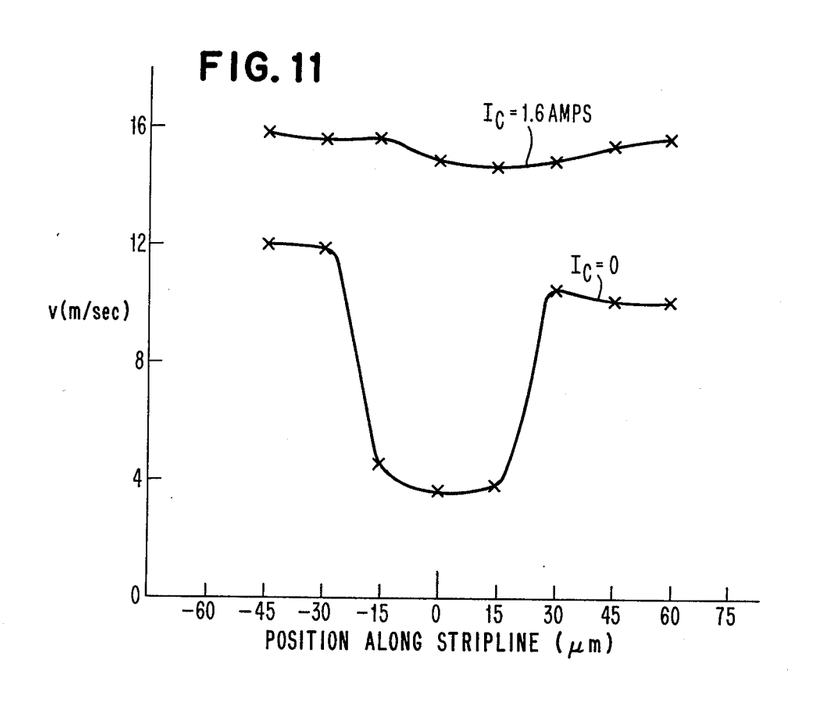
FIG. 11 shows the bubble velocity through the switch of FIG. 10 as a function of distance along the switch, in the presence and absence of switching coil current.

FIG. 11 shows the bubble velocities of the device of FIG. 10 when $I_C=0$ and $I_C=1.6$ amps. FIG. 11 is aligned below FIG. 10 so the values of velocity in FIG. 11 are aligned with and on the same scale as the device 50 in FIG. 10. Thus, looking directly down from a cross 59 in FIG. 10 one can find the corresponding velocity value in FIG. 11. The current density in the stripline 51 is $8.2 \times 10^6$ amp/$cm^2$ but it is estimated to be only about $4 \times 10^6$ amp/$cm^2$ in the control area 53. In this case $H_{bias}$ is at a sufficient level so that bubble velocities through the stripline 51 and the control area 53 are both relatively low on a curve. They may be assumed for purposes of explanation to be analogous to the $J_5$ and the $J_3$ curves in FIG. 3 respectively, with a bias of about 1200 Oe. Assuming coil 54 is caused to drive the effective control area field down to a field similar to 400 Oe in FIG. 3 for $J_3$, then the velocity moves up from about 30 m/sec to about 55 m/sec. Thus it is seen that while the velocity v is about 4 m/sec when current is off in the control area from $-15$ to $+15$ $\mu$m from the center of control area 53, when the coil is turned on the velocity v increases to about 15 m/sec. The inequality of velocity when $I_C=0$ between $+30$ $\mu$m and $-30$ $\mu$m is possibly attributable to the fact that the two ends of the stripline 51 in the experiment were unequal in length. The data points in FIG. 11 are the data points recorded over numerous measurements.

Figure 12:
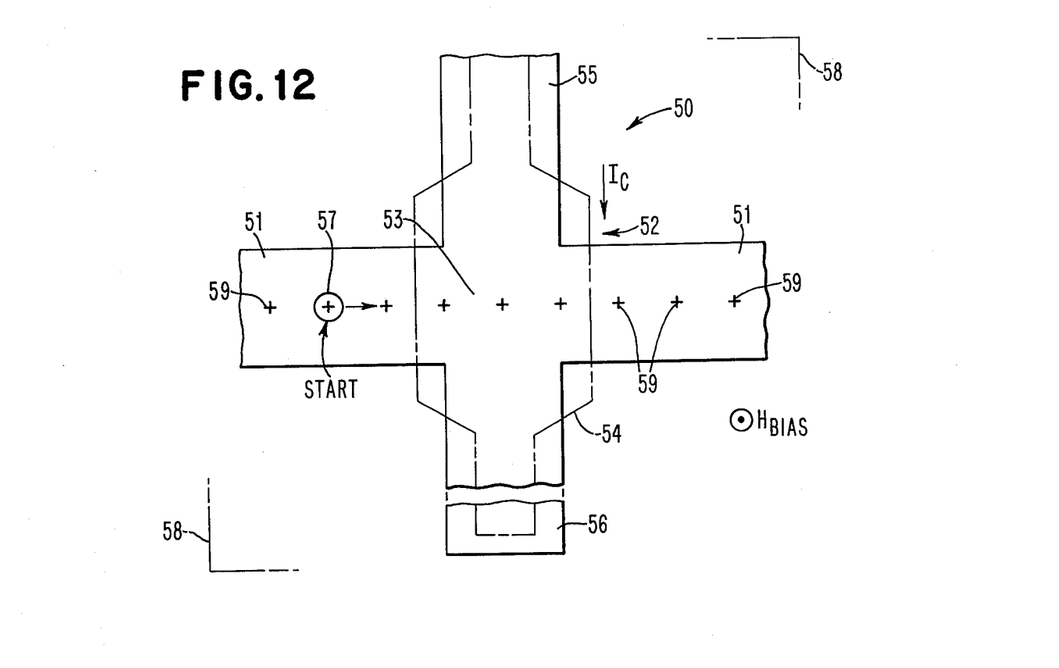
FIG. 12 shows the same switch as that of FIG. 10, with different parameters.
Figure 13:
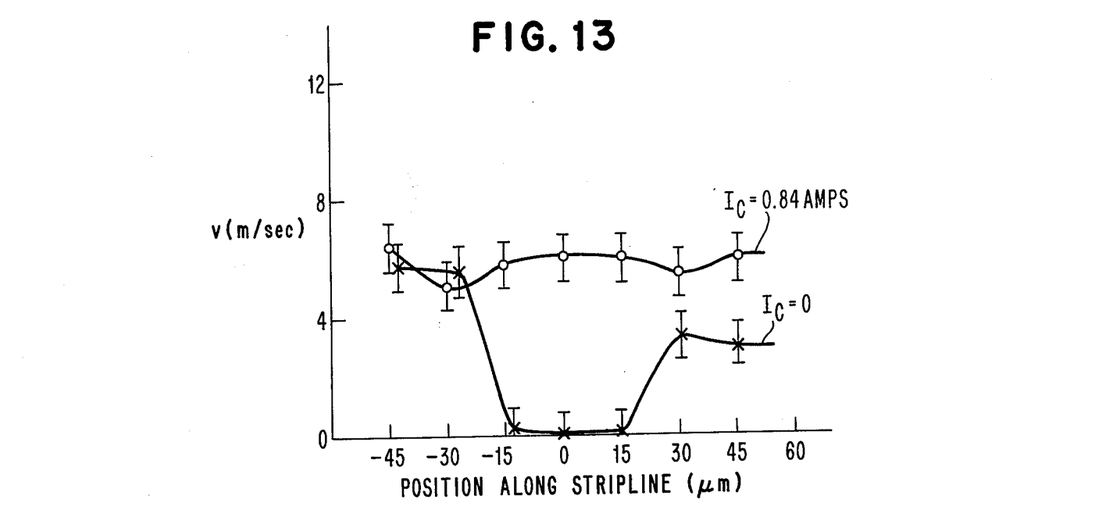
FIG. 13 shows the bubble velocity of the switch of FIG. 12 as a function of distance along the switch in the prsence and absence of switching coil current.

FIGS. 12 and 13 are similar to FIGS. 10 and 11 respectively. The differences are that the bias field $H_{bias}$ is increased, the pulse length T of the drive current pulse is doubled to T=40 nsec, and current density J is reduced to one-half from 8.2 to $4.4 \times 10^6$ amp/$cm^2$ (near the value of $J_1$ in FIGS. 2 and 3). The increase in the bias field and reduction of current density J are sufficient so that in spite of the longer drive current pulse (equal to the value used in FIG. 3) the velocity v drops to almost zero in the control area 53 as shown from 0-15 $\mu$m in FIG. 13. The narrowness of stripline 51 of device 50 probably accounts for the fact that a velocity of zero can be achieved with the high value pulse length of T and explains the divergence in the velocity from FIG. 3. The bars in FIG. 13 represent the extreme data points recorded over numerous measurements. The curves are drawn through the sets of points indicating calculated averages of the data between the extreme data points for both values of $I_c$.

Figure 14:
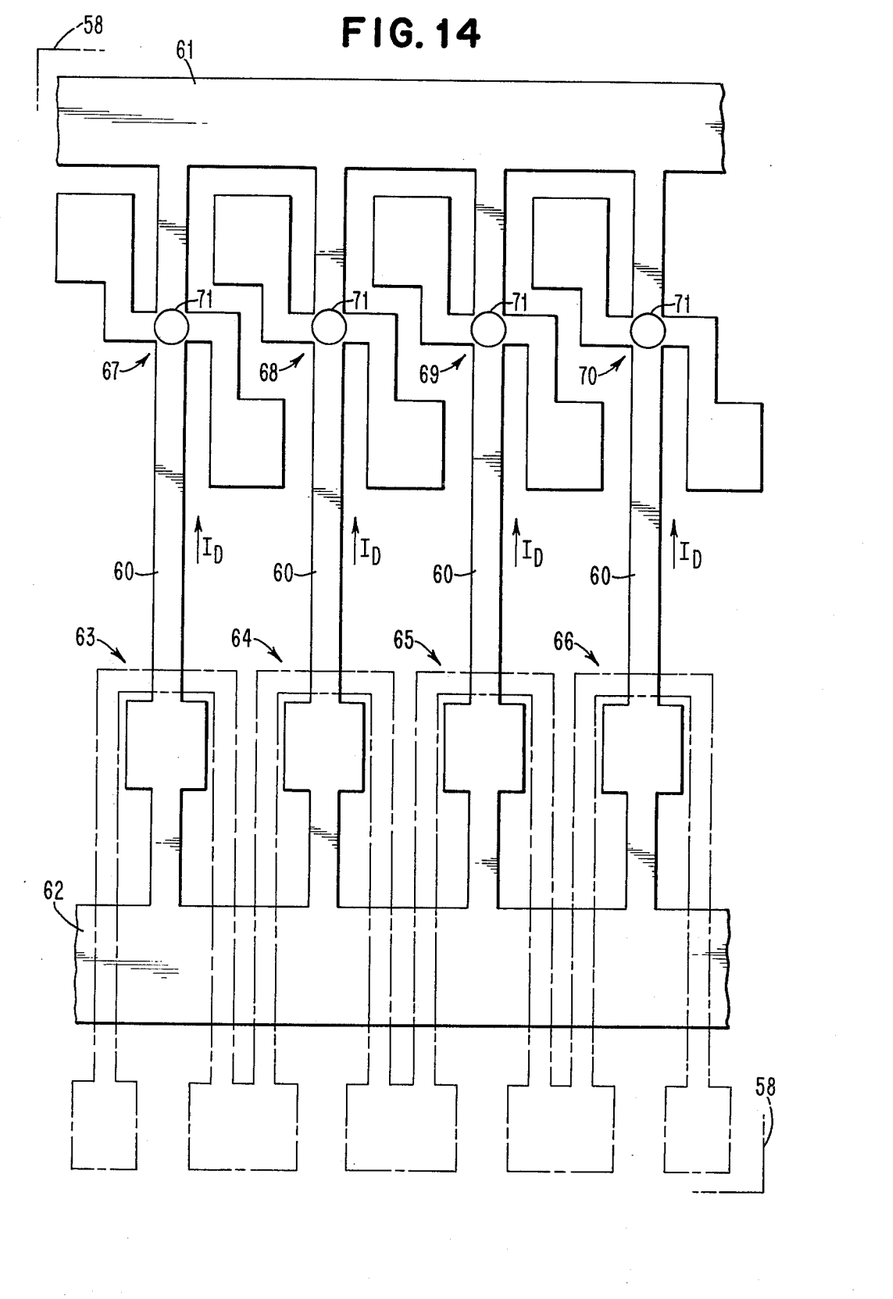
FIG. 14 shows a domain drag effect stripline shift register system.

FIG. 14 shows a domain drag information storage device consisting of a multiplicity of domain drag shift register striplines 60 operated in parallel by passing a current through striplines 60 by means of contact pads 61 and 62 across which all of the striplines 60 are connected. Each shift register is provided with one of the normally off control switches 63-66 (like the device shown in FIG. 5) and one of the Hall sensors 67-70 with permanent magnets 71 (like the device shown in FIG. 8). In operation, this device is used to process digital words, combinations of bits, representing binary numbers. For example, to enter the binary number 0001, switches 63, 64 and 65 are off and switch 66 is turned on by passing a current through the control loop of switch 66 allowing a bubble, representing a binary 1, to pass through the switch 66. Drive current pulses $I_D$ can then be used to propagate the word 0001 to the sensors. At the sensors 67-69 signals corresponding to 0001 are obtained.

Another means of locally and permanently modifying the perpendicular bias field H$_{bias}$ in FIGS. 8 and 14, as by magnet 37 in FIG. 8 and the magnets 71 in sensors 67-70 in FIG. 14, is to provide a permeable magnetic shield having an easy plane of magnetization perpendicular to the bias field H$_{bias}$ in place of magnets 37 and 71. This causes the magnetic field to be diverted from the sensor area 36 of the stripline in FIG. 8 or where magnet 71 is shown in FIG. 14.

OTHER ALTERNATIVE EMBODIMENTS

It has been proposed in the literature that the domain drag effect can be obtained in a nonconductive bubble material such as a garnet in juxtaposition with a layer of conductive film with a large Hall effect. This invention is believed to encompass embodiments employing such structures as substitutes for amorphous films such as Gd Co Mo and Gd Co Au.

While the embodiments are shown as thin films on a substrate, the structure of a stripline can also be formed as an amorphous bulk ribbon or the like, which is self-supporting without a substrate.

EXPERIMENTAL INVESTIGATION

SUMMARY

Bubble propagation by the domain drag effect was studied as a function of bias field (H$_{bias}$) in a Gd Co Au amorphous film with pulse widths of 20, 40 and 50 nsec and current densities in the $4\times10^6$ to $7\times10^6$ amp/cm$^2$ range. Experimentation consisted of pulsing current directly through a stripline of amorphous material containing hexagonal arrays of bubbles. The behavior of velocity v can be characteristically illustrated at a pulse width of 40 nsec and a current density of $6.3\times10^6$ amp/cm$^2$. With $0<H_{bias}<500$ Oe, the bubble velocity is largely independent of bias field remaining constant at a value of 65 m/sec. As the bias field was increased above 500 Oe, the velocity decreased gradually through a minimum of 35 m/sec at 1100 Oe and increased to 65 m/sec at H$_{bias}=1440$ Oe. Increasing or decreasing the pulse width or current density shifts the velocity versus bias field to correspondingly higher or lower values but does not change the velocity dependence drastically. These results are interpreted in terms of a model derived from the general expression for drive field in domain drag theory.

Introduction

In the domain drag effect bubble domains can be propagated by pulsing currents directly through photolithographically patterned striplines of bubble films. In the domain drag effect we have discovered a functional dependence of bubble propagation velocity v along the striplines on drive current for a fixed bias field. Below we discuss the effects of varying bias fields on bubble velocities over a range of drive fields and pulse widths in an amorphous Gd Co Au film. These results are then related to a model derived from Berger's general domain drag drive field expression in L. Berger, A.I.P. Conference Proceedings No. 29, 1975; pages 165-166.

Experimental Techniques

The stripline used was a 50 μm wide by 250 μm long by 1.2 μm thick sputtered amorphous Gd Co Au film fabricated by ion-beam milling. This process was found to be more effective in minimizing edge effects than using a process of photolithography combined with chemical etching which was used previously in DeLuca et al, IEEE Transactions on Magnetics, Vol. Mag.-14, No. 5, September 1978; pages 500-502. All measurements were performed at a temperature controlled at 23.0°±0.2° C. Temperature differences of ±1° C. from the control point significantly increase the scatter of data points while temperature differences of ±5° C. impair data reproducibility. Although the properties of Gd Co Au samples are more sensitive to temperature than Gd Co Mo, the superior contrast of Gd Co Au greatly extends experimental limits, particularly when data is accumulated visually as in this case. Since the Gd Co Au sample discussed here is close to the magnetic compensation temperature point (where magnetization M$_s$ is zero but diverges from zero on either side of that temperature value), the overall desirable qualities of large stripe widths, high mobility and good contrast are somewhat offset by high coercivity and greater temperature sensitivity. Another advantage of Gd Co Au for domain drag studies is that it has a relatively larger Hall angle tangent of $1.8\times10^{-2}$ as compared to $4\times10^{-3}$ for Gd Co Mo, which results in higher drive fields for lower current densities J. Values of coercivity H$_c$, Hall angle tangent β, domain diameter d$_o$, and drive field H$_D$ calculated for a current density J are compared in Table II for several alloys.

Figure 15:
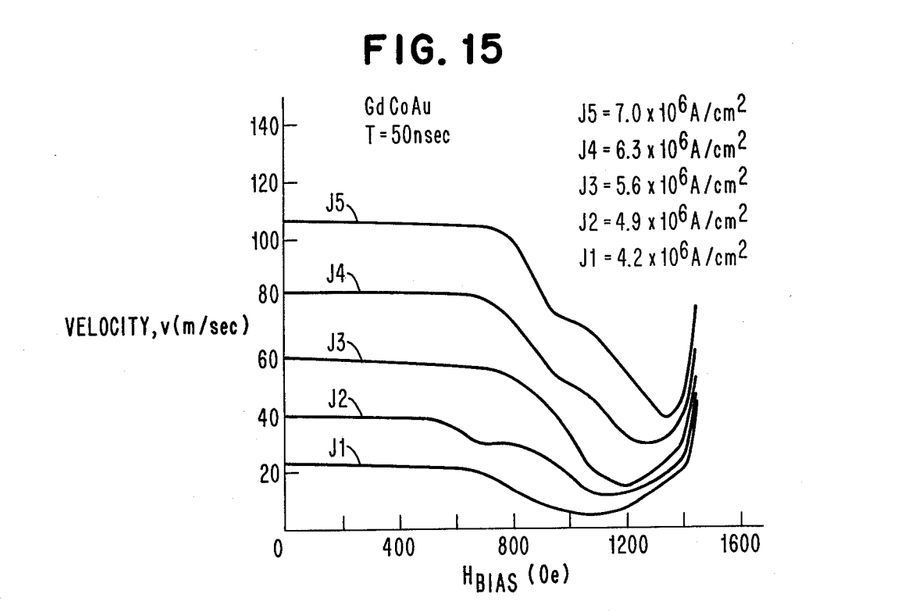
FIG. 15 is a curve of bubble propagation velocity v versus bias field for several values of current density J where T=50 nsec for a Gd Co Au alloy.

The stripline was "initialized" by raising the bias field H$_{bias}$ to about 1000 Oe and then pulsing the sample with single short strong drive current pulses I$_D$. A perpendicular bias field gradient resulting from current pulses I$_D$ creates bubbles by cutting the existing stripe domains. The bias field H$_{bias}$ is then reduced to the desired value and several I$_D$ pulses of the appropriate length and strength necessary for the purposes of the experiment are propagated down the stripline length. Bubble rafts were obtained using a current density J of $4.9\times10^6$ amp/cm$^2$ and a pulse length T of 40 nsec for $0\leq H_{bias}\leq 1440$ Oe as shown in FIGS. 19A-19F. In these experiments the velocity was always determined for bubbles at the approximate centerline of the stripline where mainly hexagonal arrays of bubbles exist. FIGS. 2, 3 and 15 show the velocity v as a function of bias field H$_{bias}$ for $4.2\times10^6\leq J\leq 7\times10^6$ amp/cm$^2$ in $0.7\times10^6$ amp/cm$^2$ increments for T=20, 40, and 50 nsec, respectively. Each data point is the result of an average of 10 identical measurements where the bubble domains are translated over a fixed distance of 7.5±0.25 μm and the displacement per pulse is determined by the translation distance divided by the number of pulses. The average velocity v$_a$ of the bubble domains is obtained by dividing the displacement per pulse by the pulse length T. The scatter of data point over most of the bias field range of H$_{bias}\leq 1200$ Oe is about ±3 m/sec with bubble translation fairly smooth and parallel to the stripline edges. A value of bias fields H$_{bias}>1200$ Oe bubble motion becomes progressively more erratic with the scatter in data points increasing to about ±10 m/sec at H$_{bias}=1400$ Oe.

Results

From FIGS. 2, 3 and 15 several observations can be made which are seen to be general characteristics of the velocity of bubble domains as a function of bias field H$_{bias}$. FIG. 2 shows that for T=20 nsec at any fixed drive and H$_{bias}\leq 400$ the velocity v remains at approximately a constant value. Above 400 Oe velocity v falls off gradually with increasing bias field $H_{bias}$. Then, after achieving some minimum value, velocity v reverses its rate of change and actually increases to higher values as $H_{bias}$ approaches 1440 Oe. Increasing or decreasing the drive current changes the current density J and $I_D$ shifts the velocity vs. bias field curves to corresponding higher or lower values. FIGS. 3 and 15 show that increasing the pulse width T to 40 and 50 nsec respectively maintains the constant velocity region to somewhat higher bias fields with the fall-off and subsequent velocity increases occurring more sharply, particularly for the T=50 nsec data. Note that for a fixed J and $H_{bias}$, the velocity increases with pulse length. Bubble velocities nearer the collapse field $H_o$ (which is defined as the bias field $H_{bias}$ at which all bubbles cease to exist, i.e., collapse) where $H_{bias}$ has a value of about 1600 Oe are much higher than those measured at the cutoff point indicated by the data at $H_{bias}$=1440 Oe. Since measurements are made visually, increasingly poor contrast and bubble sizes approaching about 0.5 $\mu$m make these higher velocities extremely difficult to determine accurately.

Figure 16:
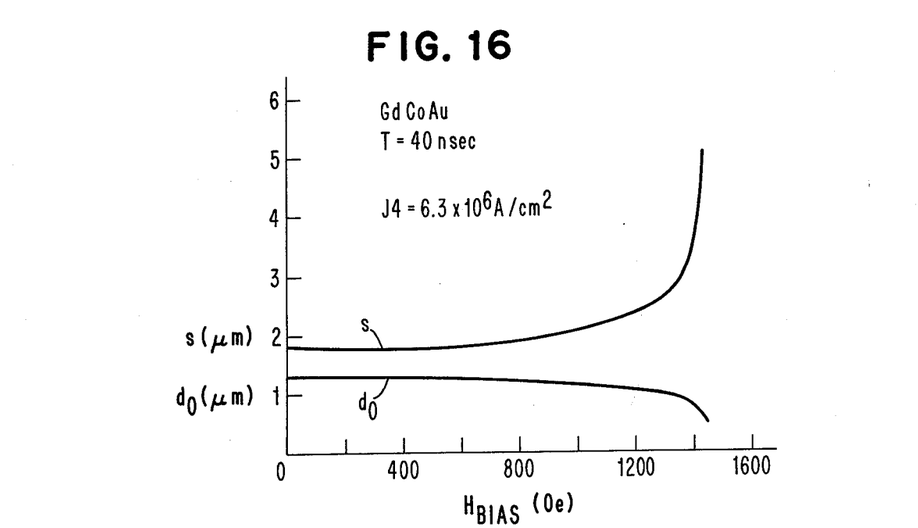
FIG. 16 shows variables s (nearest neighbor distance) and $d_o$ (static bubble diameter) as a function of bias field for a bubble material.
Figure 17:
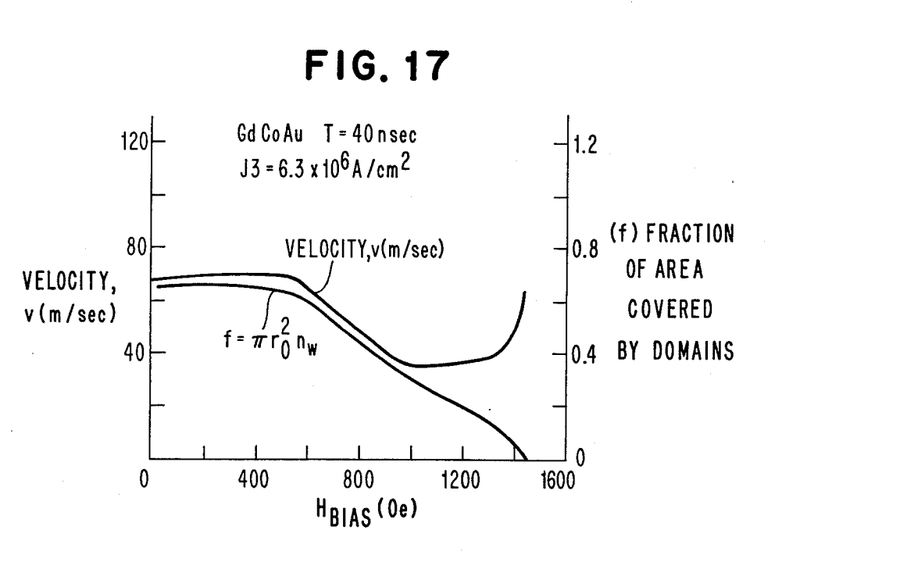
FIG. 17 compares velocity v and fraction f as a function of bias field.
Figure 19A:
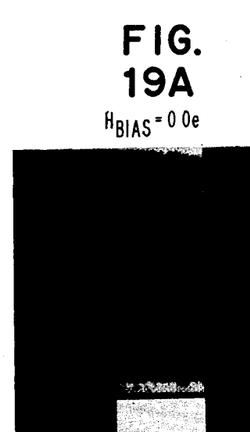
FIGS. 19A-19F show bubble patterns in a stripline for various values of bias field $H_{bias}$.
Figure 19B:
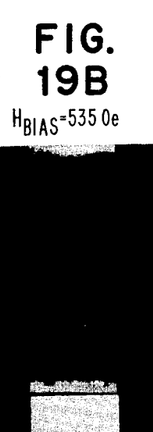
Figure 19C:
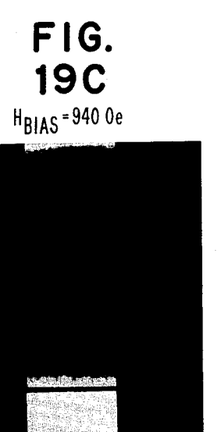
Figure 19D:
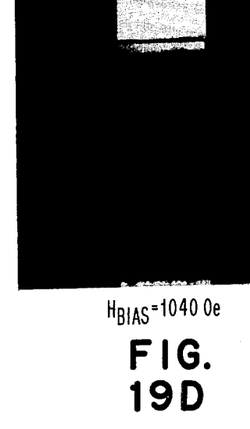
Figure 19E:
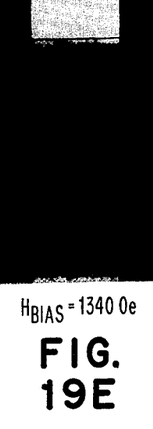
Figure 19F:
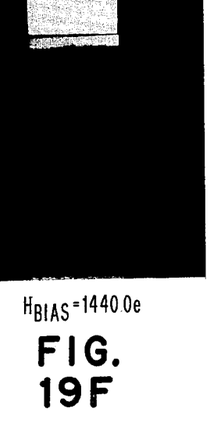

Greater insight into the velocity behavior can be obtained by correlating the $J_3=5.6 \times 10^6$ amp/cm$^2$, 40 nsec data shown in FIG. 3 with several observations drawn from FIGS. 19A–19F. The stripeline as shown in FIG. 19A with $H_{bias}=0$ is characterized by hexagonal arrays of bubbles at the center with stripe domains dominant near the edges. As the bias is increased, the number of bubble domains in a hexagonal raft configuration increases while the stripe domains shrink. Measurements on the static bubble diameter ($d_o$) and the average bubble-to-bubble nearest neighbor distances (s) as a function of bias are summarized in FIG. 16. For $H_{bias} \leq 500$ Oe only small changes occur in both $d_o$ and s. At $H_{bias}$ of approximately 800 Oe and beyond significant changes in $d_o$ and s occur, with $d_o$ decreasing and s increasing simultaneously. For $H_{bias} \gtrsim 1200$ Oe nearest neighbor distances approach about $5 \pm 1$ $\mu$m while bubble size is reduced to almost $0.5 \pm 2$ $\mu$m. FIGS. 19E and 19F show that with $H_{bias}$ more or less equal to 1340 (FIG. 19E) and 1440 (FIG. 19F) respectively, the bubble raft is grossly distorted with its hexagonal symmetry all but destroyed and single bubble propagation is a more appropriate description of bubble motion. It is interesting to note that the onset of erratic bubble behavior closely coincides with the onset of significant distortion in the hexagonal symmetry of the bubble raft. This occurs roughly at $H_{bias}$=1200 Oe. FIG. 17 is a replot of $J_3$ in FIG. 3 with velocity v shown as a function of $H_{bias}$ for T=40 nsec at $0 \leq H_{bias} \leq 1205$ Oe compared with the fraction (f) of area covered by magnetic domains of any kind, including bubbles. The displacement of the curves for $H_{bias} > 535$ Oe will be discussed below.

Discussion

Berger's expression for the drive field $H_D$ in domain drag is:

$$H_D = \frac{aJ\delta\rho}{2M_s R} \quad (1)$$

where "a" is the distance between cusps in the current (discontinuity or divergence in the direction of the current as at a domain wall) and "a" is approximately equal to d where d is the bubble diameter. The value $\delta\rho$ is the domain drag contribution to the resistivity. R is the Hall coefoefficient. In a magnetic material the Hall resistivity, $\rho_H$, is given by two contributions, the ordinary Hall coefficient, $R_o$, and the spontaneous Hall coefficient, $R_s$, so that:

$$\rho_H = R_o B = R_s M_s \quad (2)$$

In the amorphous rare earth-transition (RE-TM) metal alloys $R_o << R_s$ so we may write:

$$\rho_H = R_s M_s \text{ or } R = R_s = \frac{\rho_H}{M_s} \quad (3)$$

The domain drag contribution to the resistivity, $\delta\rho$, for a bubble lattice is given by L. Berger, J. Appl. Physics, 49, 2156 (1978):

$$\frac{\delta\rho}{\rho} = -2f\frac{\beta^2}{(1+\beta^2)^{\frac{1}{2}}} \quad (4)$$

when f is the fraction of the area covered by magnetic domains such as bubbles. In RE-TM alloys $\beta$, the tangent of the Hall angle ($=(\rho H/\rho)$) is $10^{-2}$ to $10^{-3}$ [McGuire et al IEEE Trans. on Magnetics, MAG-13, 1598 (1977)], so $$\beta^2 << 1 \text{ and } \left|\frac{\delta\rho}{\rho}\right| \simeq 2f\beta^2 \text{ or } \delta\rho = 2f\rho\beta^2 \quad (5)$$

Substituting 3 and 5 into 1 we obtain:

$$H_D = \frac{dJ2f\rho\beta^2}{2M_s(\rho_H/M_s)} = dJf\frac{\rho}{\rho_H}\beta^2 \quad (5)$$

Since $\rho H/\rho = \beta$ we may write:

$$H_D = dJf\beta \quad (7)$$

The fractional area is given by $f = \pi r_o^2 n_w$, where $r_o$ is the static bubble radius which decreases with increasing bias field and $n_w$ is the number of bubbles per unit area. FIG. 17 shows a velocity $J_3=6.3\times 10^6$ and T=40 nsec replotted from FIG. 3 compared to f as a function of bias field. The fraction of the area covered by domains was determined by direct measurements of $d_o$ and $n_w$ from photographs shown in FIGS. 19A–19F.

The velocity is given by:

$$v = \mu(H_D - H_c) = \mu(J\beta fd - H_c) \quad (8)$$

We have observed in our experiments that at a fixed bias field $H_{bias}$ and a fixed current density J, the velocity v increases significantly with an increasing pulse length T. In equation 8 the only terms which might be pulse length dependent are $H_c$ and d. Barbara et al, Appl. Phys. Lett. 31, 133 (1977) have reported a pulse length dependence of the threshold drive field in gradient propagation experiments. This effect can be interpreted as a pulse length dependent effective coercivity. Experimentally, we have observed that the effective coercivity $H_{ceff}$ decreases with increasing pulse length T. An alternative possibility we propose here which is based upon our observations is that the domains are increasing in diameter or striping out (expanding rapidly in diameter) during the time of the pulse (which we have observed) so that d in equation 8 is not the static bubble diameter $d_o$ but the temporarily striped out (increased) diameter D.

$$D = d_o + \Delta d \tag{8a}$$

where $\Delta d$ is the distance the bubble stripes out (expands) during the time T so that: $\Delta d = v_{so}T$ where $v_{so}$ is the velocity of bubble stripe out. We will analyze our data in terms of the stripe out model and then return to the coercivity question.

Figure 18:
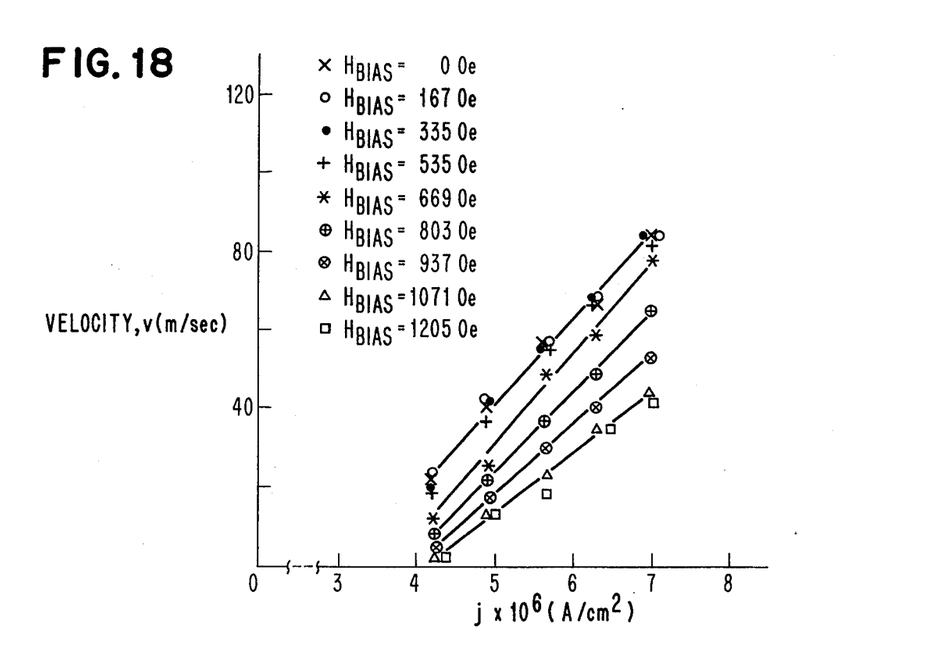
FIG. 18 shows velocity v as a function of J for various values of bias field.

To obtain $\Delta d$ from the experimental data the slopes of the v vs. J curves in FIG. 18 were used to obtain an apparent mobility $\mu'$ assuming that the bubble diameter is constant (equal to $d_o$) so that $\mu'$ is defined as:

$$\mu' = \frac{(\Delta v/\Delta J)}{f\beta d_o} \tag{9}$$

When $\mu'$ is plotted vs. T it is found to increase approximately linearly with T and to extrapolate to about 20 m/sec Oe at T=0 for all bias fields $H_{bias}$. This value of 20 m/sec Oe was taken as the actual mobility $\mu$ and used to obtain D from:

$$D = \frac{(\Delta v/\Delta J)}{\mu \beta f} \tag{10}$$

where $\mu = 20$ m/sec.

The stripe out velocity, $v_{so}$, could then be calculated from:

$$v_{so} = \frac{\Delta d}{T} = \frac{D - d_o}{T} \tag{11}$$

It was found that $v_{so}$ is approximately constant for a given bias field but increases rapidly with bias. Having obtained D from equaton 10, it is possible to evaluate $H_c$ from $J_c$ the zero velocity extrapolation of the velocity v vs. J plots of the type shown in FIG. 18. It can be seen from equation 8 that when v=0, $$H_c = J_c \beta f D \tag{12}$$

The results of this analysis are shown in Table I. Note that the coercivity obtained from equation 12 is very constant at 4 Oe up to a bias field $H_{bias}$ of 600 Oe then decreases rapidly to about 0.4 Oe at 1400 Oe. The low bias field value of 4 Oe is in good agreement with the value measured from Hall effect (perpendicular field) loops.

The results of this analysis can be recast in terms of a coercivity dependent on bias field $H_{bias}$ and pulse length T by treating the stripe out contribution to the drive field at threshold $J_c \beta f \Delta d$ as a pulse length dependent decrease in coercivity, $\Delta H_c$ so that $\Delta H_c = J_c \beta f v_{so} T$. Equation 8 then becomes:

$$v = \mu [J \beta f d_o - H_{c\mathit{eff}}] \tag{14}$$

where the effective coercivity $H_{c\mathit{eff}} = H_c - \Delta H_c$. Values of $H_{c\mathit{eff}}$ are listed in the last column of Table I.

The effective coercivity decreases rapidly with bias field $H_{bias}$ and slowly with pulse length T. The dependence of effective coercivity $H_{c\mathit{eff}}$ on the bias field $H_{bias}$ and the pulse length T is still being studied. The stripe out model seems to indicate that the stripe out would have to reach several microns to account for the high velocities observed at a high bias field $H_{bias}$. We believe that the velocity upturn occurs because at a high bias field the effective coercivity is decreasing faster than the drive field $H_D$ is decreasing. At low fields where $H_{c\mathit{eff}}$ is only weakly dependent on the bias field, equation 8 is a good approximation of the velocity dependence of f as shown in FIG. 17.

Discussion of Prior Art

As suggested by DeLuca et al, supra, it appears that velocity v varies as follows:
$v = \mu(H_D - H_c)$, where
  $H_D$ = drive field
  $\mu$ = mobility
  $H_c$ = bubble material coercivity
Equation 7 above also teaches that $H_d = dJf\beta$, where
  d = bubble diameter
  J = current density
  f = percentage of bubble area to total area
  $\beta$ = Hall angle We have discovered that d decreases as $H_{bias}$ is increased to reach a minimum at a critical value at which d stripes out causing $H_D$ to increase, at the same time that the bubble area fraction f is decreasing. Nothing in the prior art suggests that $H_{bias}$ increases where $H_D$ was originally larger than $H_c$ that the relative values of $H_D$ and $H_c$ would be equal or $H_D$ less than $H_c$ and thus provide a value of zero velocity v. Moreover, nothing in the prior art suggests any practical application of this phenomenon for any purpose. Nothing in the prior art indicates that $H_D$ declines as $H_{bias}$ increases. The presence of a minimum value of velocity is totally unpredictable based on the prior art.

Conclusions

We find that the velocity of domain drag bubble raft propagation follows the drive field expression derived from Berger at low bias field. The data can be fit for all bias fields if it is assumed that the coercivity and bubble size are not static values but are functions of pulse length T and drive field $H_D$. The coercivity is not measured by low field quasi-dc methods but instead it is measured by an effective coercivity which is a function of bias field $H_{bias}$ and pulse length T. The physical significance of effective coercivity is the subject of continued study.

TABLE I

| $H_{bias}$ Oe | $d_0$ μm | f | T nsec | $\Delta v/\Delta J$ (units of $10^{-9}$) m³/amp-sec | D μm | $\Delta d$ μm | $J_c$ (units of $10^{10}$) amps/m² | $H_c$ Oe | $\Delta H_{c\mathit{eff}}$ Oe | $H_{c\mathit{eff}}$ Oe |
|---|---|---|---|---|---|---|---|---|---|---|
| 0 | 1.3 | 0.65 | 20 | 2.27 | 1.39 | 0.09 | 3.70 | 4.20 | 0.27 | 3.93 |
|  |  |  | 40 | 2.35 | 1.44 | 0.14 | 3.25 | 3.82 | 0.37 | 3.45 |
|  |  |  | 50 | 2.44 | 1.49 | 0.19 | 3.15 | 3.83 | 0.49 | 3.34 |
| 600 | 1.25 | 0.59 | 20 | 1.97 | 1.33 | 0.08 | 4.10 | 4.04 | 0.24 | 3.80 |
|  |  |  | 40 | 2.13 | 1.44 | 0.19 | 3.45 | 3.68 | 0.49 | 3.19 |
|  |  |  | 50 | 2.42 | 1.63 | 0.38 | 3.35 | 4.05 | 0.94 | 3.11 |
| 800 | 1.20 | 0.43 | 20 | 1.52 | 1.41 | 0.21 | 4.35 | 3.31 | 0.49 | 2.82 |

TABLE I-continued

| $H_{bias}$ Oe | $d_0$ μm | f | T nsec | Δv/ΔJ (units of $10^{-9}$) $m^3$/amp-sec | D μm | Δd μm | $J_c$ (units of $10^{10}$) amps/$m^2$ | $H_c$ Oe | $\Delta H_{ceff}$ Oe | $H_{ceff}$ Oe |
|---|---|---|---|---|---|---|---|---|---|---|
| | | | 40 | 2.00 | 1.85 | 0.65 | 3.85 | 3.85 | 1.35 | 2.50 |
| | | | 50 | 2.76 | 2.55 | 1.35 | 3.70 | — | — | — |
| 1000 | 1.15 | 0.31 | 20 | 1.20 | 1.54 | 0.39 | 4.25 | 2.55 | 0.65 | 1.90 |
| | | | 40 | 1.53 | 1.96 | 0.81 | 3.85 | 2.94 | 1.22 | 1.72 |
| | | | 50 | 1.71 | 2.20 | 1.05 | 3.75 | 3.21 | 1.53 | 1.68 |
| 1200 | 1.00 | 0.20 | 20 | 0.65 | 1.29 | 0.29 | 3.15 | 1.02 | 0.23 | 0.79 |
| | | | 40 | 0.81 | 1.61 | 0.61 | 3.15 | 1.27 | 0.48 | 0.79 |
| 1400 | 0.80 | 0.06 | 20 | 0.78 | 5.19 | 4.39 | ~1 | 0.3 | 0.33 | 0 |
| | | | 40 | 0.71 | 4.78 | 3.93 | ~1 | 0.4 | 0.30 | 0.1 |
| | | | 50 | 0.70 | 4.64 | 3.84 | 1.3 | 0.5 | 0.38 | 0.12 |

TABLE II

| Sample | $H_{sat}\perp$ Oe | $H_c$ Oe | $\beta = \dfrac{\rho H}{\rho}$ | $d_o$ μm | $H_D = d\beta J$ $J = 4 \times 10^6$ amp/$cm^2$ Oe |
|---|---|---|---|---|---|
| Gd Co Mo | 840 | 1.0 | $4.2 \times 10^{-3}$ | 0.6 | 1.3 |
| Gd Co Au | >1000 | 1.5 | ~$10^{-2}$ | 1.3 | 6.5 |
| Gd Co Au | 700 | 4.0 | $1.1 \times 10^{-2}$ | 1.5 | 8.0 |

TABLE III

Data Rate-Example

Gd Co Au
$J = 4.25 \times 10^6$ amp/$cm^2$
$v = 20$ m/sec
$d = 1$ μm
$T_1$ (pulse length) = 100 nsec
$T_2$ (off time) = 1.0 μsec
$x = 2 \times 10^{-4}$ cm/pulse, where x equals the distance traversed by one bubble per pulse, and
$y = 4$ d/bit = $4 \times 10^{-4}$ cm/bit where y equals cm/bit of separation between bits in the stripline
Data rate = (x/y)

$$\text{Data rate} = \frac{2 \times 10^{-4} \text{ cm/pulse}}{4 \times 10^{-4} \text{ cm/bit}} \; 10^5 \text{ pulses/sec} = 50 \text{ bits/sec}$$

The 10% duty cycle used in Table III prevents overheating of the stripline to avoid crystallization, exceeding the Curie temperature, etc. Pulse length T and current density J must be chosen so that the temperature rise during a pulse never exceeds the Curie temperature, as explained further in Tables IV and V.

TABLE IV

Temperature Rise-Single Pulse $I^2 R(TE) - K_1(TE - TE_o) = M_1 \, dTE/dt$
$K_1$—interface thermal conductivity parameter
$M_1$—"thermal mass" of the conductor J/cm (heat capacity of stripline)
$T_1$—length of the pulse (sec)
$TE(T_1) = TE_o + TE_R [1 - \exp - T_1/T_R]$
$TE_R$ = temperature at steady state = $I^2R/K_1$
$T_R$ = rise time to steady state (sec) = $M_1/K_1$
$M_1 = 7.1 \times 10^{-7}$ J/cm length
$I^2R = 120$ w/cm (20 μm wide stripline Gd Co Au)

| Substrate | $TE_o$ | $TE_R$ | $T_R$ μsec | Temperature = TE | | |
|---|---|---|---|---|---|---|
| | | | | 20 nsec | 100 nsec | 1μsec |
| Si | 300° K. | 300° K. | 1.78 | 303° K. | 316° K. | 471° K. |

The calculations in Table IV show that the temperature rise for a 100 nsec or shorter pulse is acceptable for a given sample, which is relatively independent of composition ratios.

TABLE V

Temperature Fall as a Function of Time Following a Drive Current Pulse $TE = TE_o + TE_R [1 - \exp - T_1/T_R] \exp t/T_f$
$T_1 = 100$ nsec (pulse time)
$TE_R = 300°$ K. (Maximum temperature rise during hypothetical steady state application of drive current)
$T_f = 1.78$ μsec (thermal time constant)
$t$ = variable cooling time following pulse $T_1$

| t (cooling) μsec | $TE_o$ |
|---|---|
| 0 | 316K |
| 2 | 305.2K |
| 4 | 301.7K |
| 6 | 300.6K |
| 8 | 300.2K |
| 10 | 300.1K |

In Table V, which is self-explanatory, for excessively high duty cycles, the temperature will fail to decay sufficiently between successive drive current pulses.

TABLE VI

| | Divices for Small bubble Compared | | |
|---|---|---|---|
| Device | Position | Gradient | Limitations |
| T-I Bar or C-Bar | Permalloy lithography | Drive field + lithography | Saturation of Permalloy |
| CD | Charged Wall | Charged Wall Potential Wall | Charged Wall Stability |
| BLF | Bubble-bubble interaction | Conductor lines + lithography | Heat dissipation |
| Domain Drag | (All of the above) | Domain Size and $\beta$ | Heat dissipation |

Industrial Applicability

The domain drag effect is a new way of moving bubbles adapted for use in data processing memories. The domain drag effect offers the possibility of far smaller bubble sizes than have been achieved to date with other bubble devices. This invention offers a practical application of a radically different form of bubble motion and switching, which makes use of the fact that amorphous bubble films are conductors as contrasted with garnets, which are insulators.

Having thus described my invention, what I claim as new and desire to secure by Letters Patent is:

1. In a magnetic bubble device comprising a magnetic bubble domain material which propagates magnetic bubble domains by means of the domain drag effect, the improvement comprising control means for generating an external magnetic bias field $H_{bias}$ directed towards said device for controlling the rate of bubble propagation in said device with said magnetic bias field $H_{bias}$.

2. A magnetic bubble domain device in accordance with claim 1 wherein said magnetic bias field is variable and said rate of propagation varies with said variable magnetic bias field outside of a critical range of magnetic bias field values.

3. A device in accordance with claim 2 wherein said rate of propagation decreases to a minimum below said critical range and increases with said magnetic bias field above said critical range.

4. A magnetic bubble domain device in accordance with claim 1 wherein said device comprises a magnetic bubble domain switch for turning bubble domain propagation on and off and said external magnetic field is variable for actuating said switch.

5. A device in accordance with claim 4 wherein said device includes a stripline of bubble material deposited upon a substrate, said stripline including a switching area, and external means for generating a magnetic field in said switching area when desired to control the on and off condition in said switching area.

6. A device in accordance with claim 5 wherein said external means comprises an electromagnetic field generating element energized by an electric current.

7. A device in accordance with claim 6 wherein said element comprises a conductive loop connected to a source of direct current electricity in series with a circuit making device producing a modified magnetic field in said switching area.

8. A device in accordance with claim 5 wherein said switching area has a substantially different cross-sectional area than the remainder of said stripline.

9. A device in accordance with claim 8 wherein a separate magnetic bias field is provided whereby said switching area normally has a zero bubble propagation velocity, and said external means when energized producing a magnetic field which opposes said separate magnetic field.

10. A device in accordance with claim 5 wherein said switch has one end connected to the output of a source of bubbles and its other end connected to a second stripline joining said stripline to form a switching junction area, and second external means for generating a magnetic field in said switching junction area when desired to control the on and off condition in said switching area for encoding data in a bubble code.

11. A device in accordance with claim 1 wherein said device includes a structure of bubble domain material in the form of a stripline with a wider area having contacts at the edges thereof said wider element and said contacts forming a sensing element, and said external magnetic field being directed at said wider area for adjusting the bubble propagation velocity therein to be commensurate with that in the remainder of said stripline.

12. A device in accordance with claim 11 wherein said wider area and said contacts form a Hall effect device and said control means comprises a deposit of permanent magnet material in juxtaposition with said wider area.

* * * * *